(12) United States Patent
Arregui et al.

(10) Patent No.: US 9,496,512 B2
(45) Date of Patent: Nov. 15, 2016

(54) WEAK LIGHT DETECTION USING AN ORGANIC, PHOTOSENSITIVE COMPONENT

(75) Inventors: Jon Ajuria Arregui, Aretxabaleta (ES);
Francesco Arca, München (DE);
Oliver Hayden, Herzogenaurach (DE);
Maria Sramek, München (DE);
Sandro Francesco Tedde, Erlangen (DE); Guido Zoli, Imola (IT)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 85 days.

(21) Appl. No.: 14/128,754

(22) PCT Filed: Jun. 19, 2012

(86) PCT No.: PCT/EP2012/061724
§ 371 (c)(1),
(2), (4) Date: Apr. 4, 2014

(87) PCT Pub. No.: WO2012/175505
PCT Pub. Date: Dec. 27, 2012

(65) Prior Publication Data
US 2014/0299776 A1    Oct. 9, 2014

(30) Foreign Application Priority Data

Jun. 22, 2011 (DE) .......... 10 2011 077 961

(51) Int. Cl.
*H01L 51/42* (2006.01)
*G01T 1/20* (2006.01)
(Continued)

(52) U.S. Cl.
CPC .............. *H01L 51/424* (2013.01); *G01T 1/20* (2013.01); *G01T 1/24* (2013.01); *H01L 51/4253* (2013.01);
(Continued)

(58) Field of Classification Search
CPC ............. H01L 27/308; H01L 51/4273; H01L 51/424; H01L 51/441; H01L 51/4253; H01L 31/101; H01L 51/0037; G01T 1/20; G01T 1/24; Y02E 10/549
See application file for complete search history.

(56) References Cited

U.S. PATENT DOCUMENTS

| | | |
|---|---|---|
| 2002/0017612 A1 | 2/2002 | Yu et al. |
| 2006/0124922 A1* | 6/2006 | Kim et al. .............. 257/40 |

(Continued)

FOREIGN PATENT DOCUMENTS

| | | |
|---|---|---|
| DE | 102007015471 | 8/2008 |
| DE | 102007046444 | 4/2009 |

(Continued)

OTHER PUBLICATIONS

International Search Report for PCT/EP2012/061724, mailed Sep. 28, 2012, 3 pages.

*Primary Examiner* — David Porta
*Assistant Examiner* — Gisselle Gutierrez
(74) *Attorney, Agent, or Firm* — Slayden Grubert Beard PLLC

(57) ABSTRACT

An organic intermediate layer is used in a photosensitive component for increasing the limit frequency of the component, preferably in the range of low radiation intensities. The photosensitive component is in particular a diode having a photoactive organic semiconductor layer, a first and a second electrode. An organic intermediate layer is arranged between the photoactive semiconductor layer and at least one of the electrodes. The organic intermediate layer is in particular a charge-blocking layer.

16 Claims, 4 Drawing Sheets

(51) Int. Cl.
  *G01T 1/24* (2006.01)
  *H01L 51/44* (2006.01)
  *H01L 27/30* (2006.01)
  *H01L 31/101* (2006.01)
  *H01L 51/00* (2006.01)

(52) U.S. Cl.
  CPC ........... *H01L 51/441* (2013.01); *H01L 27/308* (2013.01); *H01L 31/101* (2013.01); *H01L 51/0037* (2013.01); *H01L 51/4273* (2013.01); *Y02E 10/549* (2013.01)

(56) References Cited

U.S. PATENT DOCUMENTS

2010/0140594 A1* 6/2010 Meng .................. H01L 51/5048 257/40

2010/0207112 A1  8/2010  Fürst et al.
2010/0326525 A1  12/2010 Nguyen et al.
2011/0095266 A1  4/2011  Hayden et al.
2012/0003485 A1  1/2012  Habich et al.
2012/0181527 A1  7/2012  Sramek et al.

FOREIGN PATENT DOCUMENTS

| | | |
|---|---|---|
| DE | 102008051656 | 4/2010 |
| DE | 102009012163 | 9/2010 |
| DE | 102009043348 | 4/2011 |
| DE | 102011077961.2 | 6/2011 |
| WO | 99/39395 | 8/1999 |
| WO | 2009/043683 | 4/2009 |
| WO | 2009/156419 | 12/2009 |
| WO | PCT/EP2012/061724 | 6/2012 |

* cited by examiner

WEAK LIGHT DETECTION USING AN ORGANIC, PHOTOSENSITIVE COMPONENT

CROSS REFERENCE TO RELATED APPLICATIONS

This application is based on and hereby claims priority to International Application No. PCT/EP2012/061724 filed on Jun. 19, 2012 and German Application No. 10 2011 077 961.2 filed on Jun. 22, 2011, the contents of which are hereby incorporated by reference.

BACKGROUND

The present invention relates to the detection of light using organic photosensitive components.

In the field of organic photodetectors, organic semiconductor-based components which can be used with high light intensities are known. The response of these organic photodetectors is, however, not fast enough for many applications. Nevertheless, the speed is crucial for industrial applications in which photodiode signals are received by electronic circuits which, for instance, are distinguished by very short integration times. The dynamic response of organic photodetectors is too low, above all in the range of low light intensities, for instance of only a few $nW/cm^2$.

SUMMARY

It is one possible object to improve this response in the low light intensity range.

The inventors propose using an organic interlayer in a photosensitive component in order to increase the cut-off frequency of this photosensitive component. This has the advantage that, by use of this organic interlayer, the photosensitive component can also be made compatible with applications which require a very fast response of the photodetector, for example in combined organic/inorganic CCD cameras, in which a high image refresh frequency is usually required.

In one advantageous configuration, the organic interlayer is used in a photosensitive component whose cut-off frequency for radiation intensities of less than 1000 $nW/cm^2$ is at least 1 Hz. In particular, the cut-off frequency in this range is at least 10 Hz, preferably at least 100 Hz. In particular wavelength ranges, the cut-off frequency in this weak light range may even be up to 1 kHz. This configuration has the advantage, by the organic interlayer for increasing the cut-off frequency, of making photosensitive components usable even in the weak light range, for instance for night-sight applications or for analytical and clinical diagnostic applications in the weak light range.

In another advantageous configuration, a charge blocking layer, in particular an electron blocking layer, is used as the organic interlayer. The organic interlayer in the photosensitive component is preferably used for interface modification between at least one of the electrodes and the photoactive semiconductor layer.

Charge blocking layers in organic photosensitive components have so far been known only for the purpose of dark current reduction, for instance from WO 2009/043683 A1.

The proposed photosensitive component comprises a photoactive organic semiconductor layer, a first electrode and a second electrode, and an organic interlayer. The organic interlayer is arranged between the photoactive semiconductor layer and at least one of the electrodes. Furthermore, the organic interlayer is configured in such a way that the cut-off frequency of the photosensitive component is at least 1 Hz. In particular, the cut-off frequency is at least 10 Hz, preferably at least 100 Hz. In particular wavelength ranges of the radiation to be detected, the component may even have a cut-off frequency in the kilohertz range.

In one advantageous configuration of the photosensitive component, it has an organic interlayer which is configured in such a way that the trap states at the interface between the photoactive semiconductor layer and at least one of the electrodes are influenced in such a way that the cut-off frequency of the photosensitive component for a radiation intensity of up to 1000 $nW/cm^2$ is at least 1 Hz. In particular, the cut-off frequency in this radiation range of up to 1000 $nW/cm^2$ is at least 10 Hz, preferably at least 100 Hz. Depending on the wavelength and the sensitivity of the component, the cut-off frequency may even lie in the kilohertz range. For example, an increase in the cut-off frequency may also be ensured for radiation intensities of less than 100 $nW/cm^2$. Preferably, the cut-off frequency for radiation intensities of up to 100 $nW/cm^2$ is more than 10, in particular more than 100 Hz.

In another advantageous embodiment of the photosensitive component, it has a cut-off frequency of at least one hertz for radiation intensities of up to 1000 $nW/cm^2$ in the visible wavelength range and in the near infrared or in the near UV wavelength range.

In particular, the organic interlayer of the photosensitive component is a charge blocking layer, in particular an electron blocking layer. Whether it is an electron or hole blocking layer may be dictated by the stack structure of the component.

The photoactive organic semiconductor layer of the photosensitive component comprises, in particular, a bulk heterojunction. This embodiment is of particular advantage specifically for planar structures of the photodetector.

For example, the photosensitive component is configured in such a way that the organic interlayer is arranged between the photoactive semiconductor layer and the two electrodes, or an interlayer is respectively arranged between the photoactive semiconductor layer and each of the two electrodes. Thus, instead of modifying just one electrode/semiconductor interface with an interlayer, both electrode/semiconductor interfaces may have an interlayer, which leads to a further improvement in the response.

In another advantageous embodiment of the photosensitive component, it has a substrate on which the first electrode and the second electrode are arranged. The organic interlayer is arranged between the photoactive semiconductor layer and the substrate having the two electrodes. The organic interlayer is in this case advantageously deposited on an inorganic substrate. As an alternative, for example, the photosensitive component has a substrate on which the photoactive semiconductor layer is arranged, the organic interlayer is arranged on this photoactive semiconductor layer and the two electrodes are in turn arranged on the organic interlayer. These two embodiments have the advantage that only one organic interlayer is respectively deposited in the component.

In another advantageous embodiment of the photosensitive component, the organic interlayer is a monomolecular layer, which is in particular a self-organizing monomolecular layer. Such layers are also referred to as SAMs (self-assembled monolayers). These SAMs have the advantage of being ideally adaptable to the interface by their molecular constituents. For example, anchoring groups and end groups of the self-organizing molecule may be adapted to the substrate and adjoining semiconductor. Furthermore, the dielectric behavior of the layer can be modulated by varying the chain length.

In another advantageous configuration, the photosensitive component has at least one electrode which comprises nanoparticles. These nanoparticulate electrodes have proven advantageous for rapid response. By nanoparticulate electrodes, the cut-off frequency of the component can be increased even further.

In particular, one or more of the photosensitive components described are arranged in an X-ray detector having a scintillator unit. These have a preferred application in radiography, mammography, dosimetry, fluoroscopy and angiography. Particularly in diagnostic applications, a low X-ray dose is to be sought. For this reason, the scintillator unit also emits only a low light signal, in particular less than 1000 $nW/cm^2$. Furthermore, these are pulsed methods in which a very fast response of the photodiode that detects the scintillation radiation is important. The photosensitive component is therefore of particular advantage for the X-ray detector described.

In the detection method for electromagnetic radiation, an organic interlayer is used in a photosensitive component, which leads to an increase in the cut-off frequency of this component. In an advantageous embodiment of this detection method, for radiation intensities of up to 1000 $nW/cm^2$, an organic interlayer which contributes to an increase in the cut-off frequency to at least 1 Hz is used in a photosensitive component. In particular, a cut-off frequency of at least 10, preferably at least 100 Hz, is achieved by the use of an organic interlayer in the detection method. The radiation range for such cut-off frequencies may, in particular, also lie below 100 $nW/cm^2$.

BRIEF DESCRIPTION OF THE DRAWINGS

These and other objects and advantages of the present invention will become more apparent and more readily appreciated from the following description of the preferred embodiments, taken in conjunction with the accompanying drawings of which.

DETAILED DESCRIPTION OF THE PREFERRED EMBODIMENT

Figure 1:
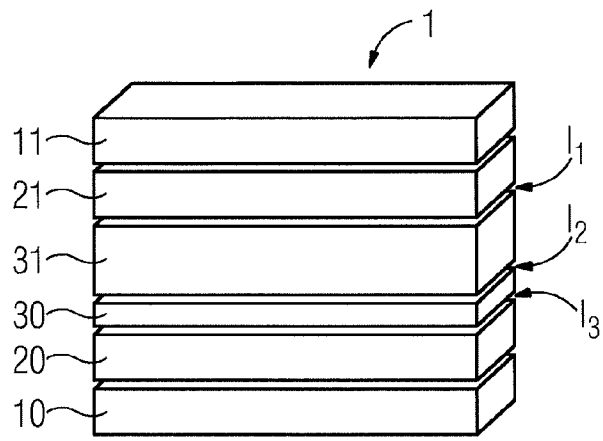
FIG. 1 shows a vertical structure of an organic photosensitive component.

Reference will now be made in detail to the preferred embodiments of the present invention, examples of which are illustrated in the accompanying drawings, wherein like reference numerals refer to like elements throughout.

FIG. 1 schematically shows the structure of a photosensitive component 1. To this end, six layers are arranged above one another. The lowermost layer is the substrate 10 of the component 1. An anode 20 is deposited thereon. The interlayer 30 is shown above this, and in turn the photoactive semiconductor 31 above the latter. This photoactive semiconductor layer 31 stands, in particular, for a bulk heterojunction. This is followed above by the cathode 21, on which an encapsulation layer 11 is also shown. Encapsulation of the components is customary in the field of organic semiconductors, in order to protect air- and moisture-sensitive materials against degradation. At the side of the perspective layer view, the interfaces $I_1$, $I_2$, $I_3$ between the stacked layers are also denoted. All these interfaces $I_1$, $I_2$, $I_3$ preferably have trap states which influence the dynamic behavior of the photodetector 1.

There are also such trap states inside the organic semiconductor 31, which is configured in particular as a bulk heterojunction, although these are substantially more difficult to access than the trap states at the interfaces $I_1$, $I_2$, $I_3$.

Figure 2:
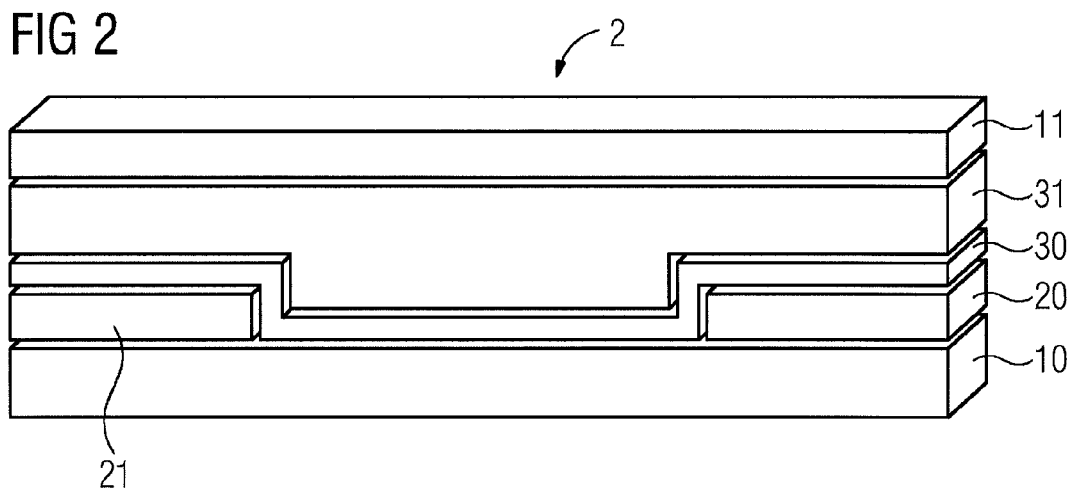
FIG. 2 shows a planar structure having a bottom contact.
Figure 3:
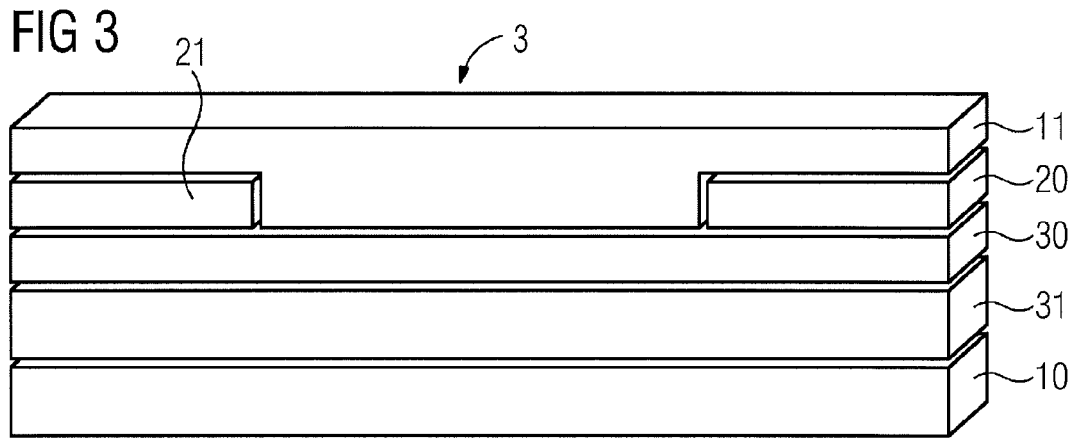
FIG. 3 shows a planar structure having a top contact.

FIGS. 2 and 3 respectively show an alternative structure of a photosensitive component 2, 3, in which the two electrodes 20, 21 can be separated from the semiconductor 31 respectively by only one interlayer 30 per component 2, 3. In FIG. 2, a substrate 10 is again shown as the lowermost layer, on which two layers horizontally separated from one another lie, these standing for the two electrodes, the cathode 21 and the anode 20. The interlayer 30 has been deposited over these electrodes 20, 21, and also covering the rest of the substrate 10. The organic semiconductor layer 31 has been deposited above the interlayer 30, and an encapsulation 11 is again shown thereon. A component 2 constructed in such a way may also be referred to as a bottom contact structure since the two electrodes 20, 21, i.e. the contacts, lie at the bottom of the component 2 and in the structural sequence at the very bottom on the substrate 10.

The photosensitive component 3 in FIG. 3 is constructed the other way around, having a so-called top contact. To this end, the organic semiconductor 31, in particular the bulk heterojunction 31, is firstly deposited on the substrate 10, and the interlayer 30 is deposited thereon. Two electrodes, the anode 20 and the cathode 21, are deposited on this interlayer 30 while being horizontally separated from one another, and an encapsulation 11 is again deposited thereon.

The vertical stack structure 1 shown, as well as the bottom contact structure 2, are particularly suitable for interlayers 30 which comprise an SAM, a self-organizing monolayer, since these can particularly preferably be deposited on organic substrates such as the electrode materials 20, 21 constitute, depending on the molecule selection.

Figure 4:
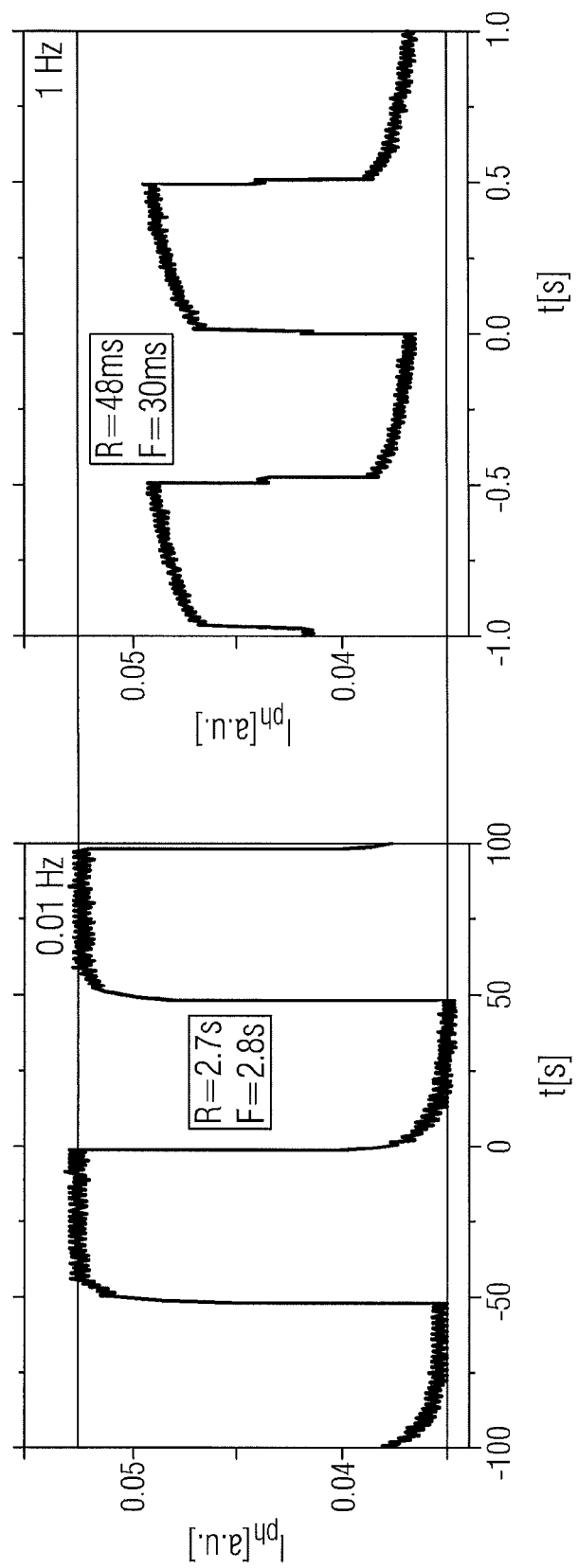
FIG. 4 shows the photocurrent of a component having an aluminum cathode.
Figure 5:
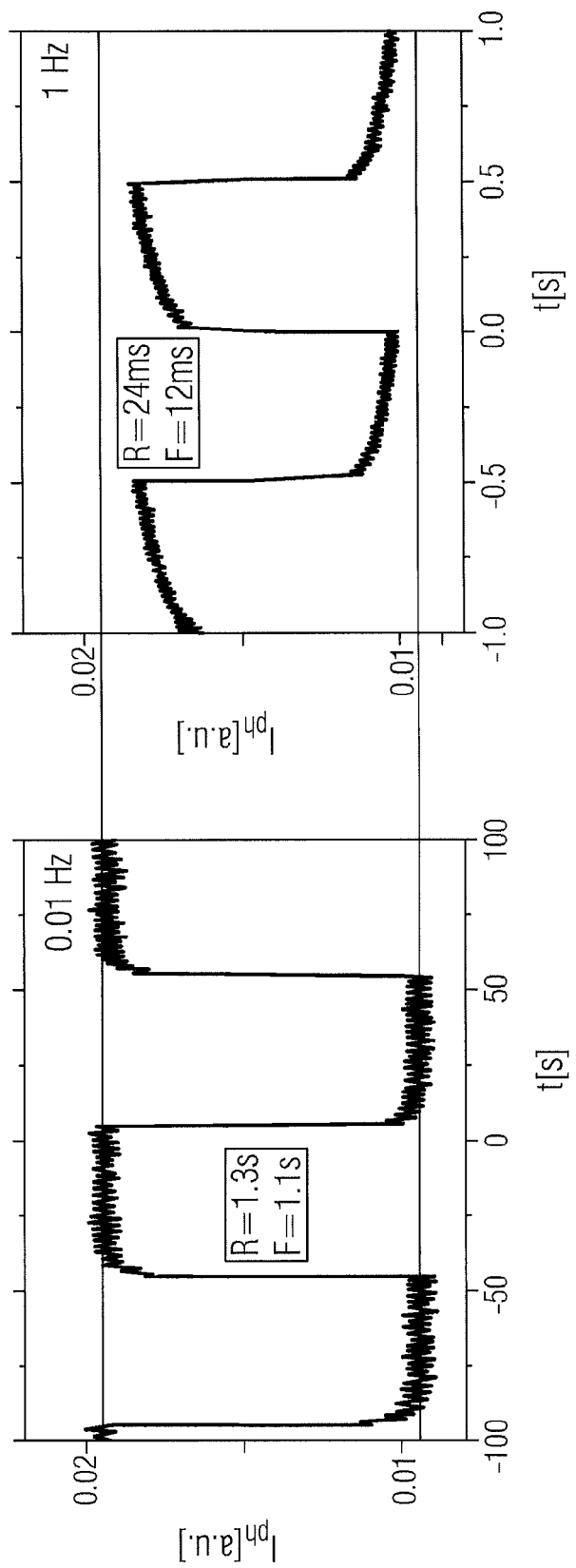
FIG. 5 shows the photocurrent of a component having a zinc oxide cathode.

FIGS. 4 and 5 show the time profile of the photocurrent $I_{ph}$ which was measured on photodetectors 1 in the vertical structure. In this case, the upper contacts, that is to say the cathode 21 in FIG. 4, are aluminum which has been applied by resistive evaporation, and in FIG. 5 a zinc oxide electrode formed of zinc oxide nanoparticles. The photocurrent $I_{ph}$, i.e. the signal amplitude when the photodetector 1 is irradiated, is indicated firstly in arbitrary units. The measurement of the photocurrent $I_{ph}$ was carried out with an oscilloscope. FIGS. 4 and 5 show that an organic photodetector 1 exhibits about 2 times as fast a response under weak light conditions when one of the electrodes, such as here for example the top electrode 21 which is connected as a cathode, comprises a nanoparticle layer, in comparison with the evaporated aluminum cathode.

In the measurements shown in FIGS. 4 and 5, a pulsed green light source which emits light with a wavelength λ of 530 nm was operated with a light intensity $I_\lambda$ of 23 $nW/cm^2$ and thereby directed onto two different photodetectors 1, which differ in terms of their cathode 21. The time t in seconds is plotted along the x axis, and the photocurrent $I_{ph}$ is plotted along the y axis of the diagrams. Light pulses with a duration of 50 s are recorded in the respective left-hand diagrams of FIGS. 4 and 5, and light pulses with a duration of 0.5 s are recorded in the respective right-hand diagrams of FIGS. 4 and 5. That is to say, the frequency difference between the two diagrams is a factor of $10^2$, the frequency increasing from 0.01 Hz to 1 Hz. In the respective left-hand diagrams with the long 50 s pulse, it can be seen that the component 1 can still follow the light pulse signal well. The component 1 with the aluminum cathode, the measurement of which is shown in FIG. 4, forms its signal $I_{ph}$ within 2.7 s. This time of 2.7 s is denoted by R for rise time in the diagram. This time R indicates how long it takes for the signal $I_{ph}$ to rise from 10% to 90% of its value. Correspondingly, the so-called fall time, how long it takes until the signal $I_{ph}$ has fallen from 90% back to 10% of its value, is indicated by F. For the component 1 with an aluminum cathode 21, the fall time F is 2.8 s. In the case of the nanoparticulate zinc oxide electrode 21 for the component 1 in FIG. 5, the rise time R is 1.3 s and the fall time F is 1.1 s. If the long light pulse is now reduced from 50 s to 0.5 s, the response of the photodetectors 1 changes in the following way: The rise time R for the photodetector 1 having an aluminum cathode 21 is 48 ms and its fall time is 30 ms. The rise time R for the component 1 having a particulate zinc oxide cathode 21, on the other hand, is only 24 ms and the fall time F is only 12 ms.

In the respective right-hand diagrams of FIGS. 4 and 5, the signal amplitude, i.e. the photocurrent $I_{ph}$, is about 30% less than the original signal in the case of the long light pulse. This decrease by 3 dB is characteristically to be determined measured around the cut-off frequency $f_{CO}$ of the component 1. To this end, for example, the frequency is gradually increased until only a maximum signal level which lies 3 dB below the amplitude at the lower frequency is still formed in the signal $I_{ph}$.

The cut-off frequency $f_{CO}$ is preferably determined with a sinusoidally modulated light source. With a decreasing light intensity $I_\lambda$, this cut-off frequency $f_{CO}$ also decreases.

Figure 6:
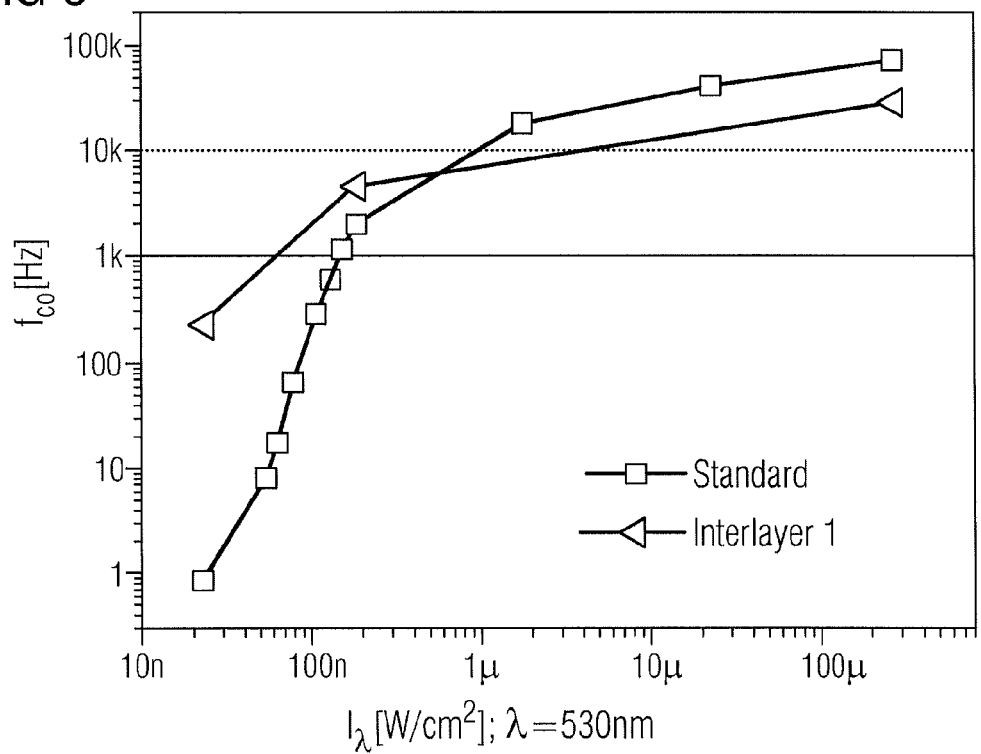
FIG. 6 shows the cut-off frequency profile of a component having a P3HT electron blocking layer.
Figure 7:
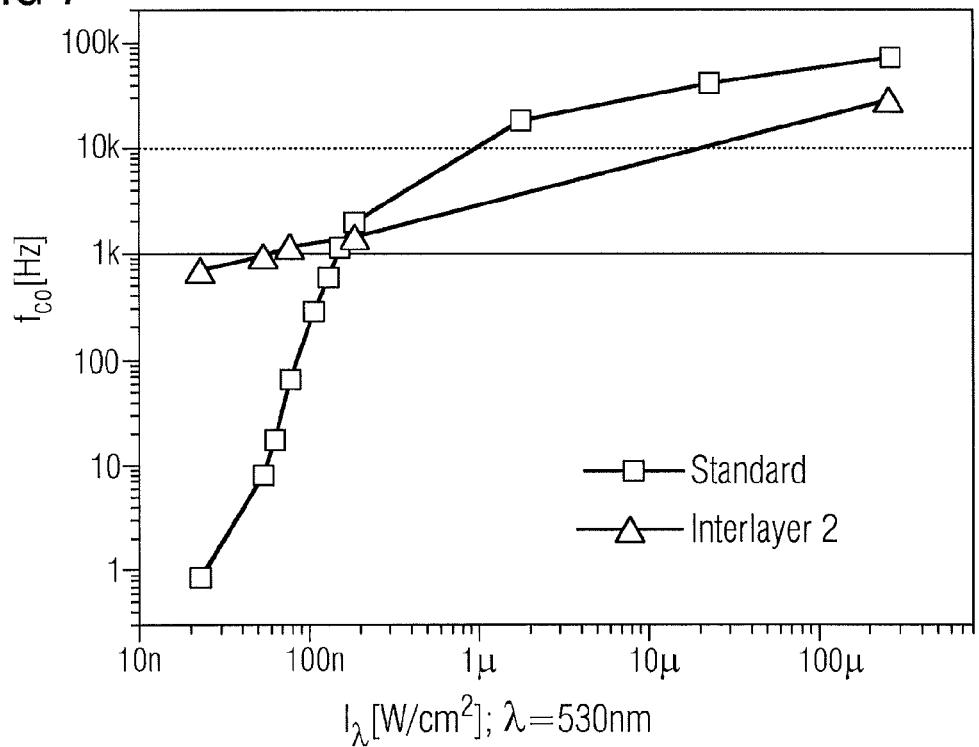
FIG. 7 shows the cut-off frequency profile of a component having a SAM electron blocking layer.

The cut-off frequency $f_{CO}$ is plotted in FIGS. 6 and 7 respectively for two photodetectors 1 having different interlayers 30, in each case in comparison with a standard component. The light source used for the measurement exposes the photodetector 1 to light with a wavelength $\lambda$ of 530 nm and light intensities $I_\lambda$ of between a few nW and several $\mu W/cm^2$. The standard component, the measurement points of which are represented by squares in the diagram, exhibits a typical drastic decrease of the cut-off frequency $f_{CO}$ in the range of low light intensity, in particular below 1000 $nW/cm^2$, particularly significantly in the range of 100 $nW/cm^2$ and less. There, the cut-off frequency $f_{CO}$ of the standard component decreases to 1 Hz. The diode area of the component 1 used is 1 $cm^2$. The interlayers 30 employed for FIGS. 6 and 7, which were used in the photosensitive components 1, are denoted as interlayer 1 and interlayer 2 in the diagrams.

Interlayer 1 is a layer of P3HT, which is deposited as an electron blocking layer 30, again in the vertical structure 1 according to FIG. 1. The structure of the comparative component is the same as the component having the P3HT interlayer, except that PEDOT:PSS is used as the interlayer 30 in the so-called standard component. For light intensities $I_\lambda$ in the range of a few $nW/cm^2$, the dynamic response of the P3HT component increases by two orders of magnitude compared with the standard component having a PEDOT:PSS interlayer.

An alternative interlayer 30 is shown in FIG. 7. Interlayer 2 stands for an interlayer 30 of a self-organizing monolayer of aliphatic molecules, which in turn constitutes an electron blocking layer. In a similar way to the test in FIG. 6, this interlayer 2 is again compared with a standard component 1 having a PEDOT:PSS interlayer. In the region of low intensity $I_\lambda$ of a few $nW/cm^2$, the component 1 having an SAM interlayer 2 exhibits a rise in the dynamic response by about 3 orders of magnitude compared with the standard component 1 having a PEDOT:PSS interlayer 30.

Such an interlayer 30 having a self-organizing monolayer has the advantage of offering a wide variety of interlayers by variation of anchoring group, chain length and end group, which can be adapted to the electrode material 20, 21 and subsequently the organic semiconductor material 31 of the photoactive semiconductor layer. Self-organizing monolayers may be deposited from the gas phase, but also from solution.

Examples of suitable self-organizing molecules have the general Formula 1:

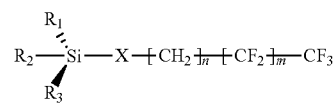

where
$R_1$, $R_2$, $R_3$ independently of one another are Cl or alkoxy, in particular methoxy, ethoxy or OH;
x may be O, S, NH or not present;
n lies in the range of between 0 and 5, and is preferably 0;
m lies between 0 and 20, in particular between 5 and 10.
Instead of —$CF_3$, polar groups are also suitable, for example —$NH_2$, as is the case for example in the molecule 3-aminopropyl-methyldiethoxysilane.

Formula 1 may be extended as shown below to Formula 2, so that ether units lie between the individual constituents of the molecule chain. In particular, the following would then be preferred:
h and f are equal to 2 or lie in general between 1 and 4;
$X_1$, $X_2$ and $X_3$ may independently of one another be O, S, NH, a halogen, for example F, or not present at all;
n lies in the range of between 0 and 2, and is preferably 0;
m lies between 0 and 15, in particular between 2 and 5.
The $CF_3$ group at the end of the molecule chain may also be omitted. In this case, $X_3$=F.

Formula 2

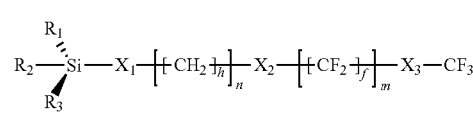

Instead of —$CF_3$, polar groups are also suitable, for example —$NH_2$.

Alternative examples of suitable self-organizing molecules are phosphonic acids, for instance of ethyl- or octadecylphosphonic acids, which have the general Formula 3:

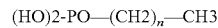

In this case, n lies in the range of between 1 and 17, and is preferably 17. As an alternative to aliphatic phosphonic acids, it is also possible to use phosphonic acids having polar head groups, for example the following molecule:

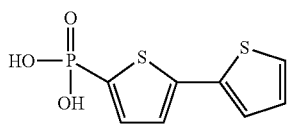 [SMILES: O=P(O)(O)c1ccc(-c2cccs2)s1]

Alpha-bithiophene-2-phosphonic acid is, for example, particularly compatible with the bulk heterojunction system used here.

The invention has been described in detail with particular reference to preferred embodiments thereof and examples, but it will be understood that variations and modifications can be effected within the spirit and scope of the invention covered by the claims which may include the phrase "at least one of A, B and C" as an alternative expression that means one or more of A, B and C may be used, contrary to the holding in *Superguide* v. *DIRECTV*, 69 USPQ2d 1865 (Fed. Cir. 2004).

The invention claimed is:

1. A method of producing a photosensitive component, the method comprising:
   forming a photoactive organic semiconductor layer, a first electrode, and a second electrode;
   forming an organic interlayer to dispose a first interlayer interface between the photoactive organic semiconductor layer and the first electrode and dispose a second interlayer interface between the photoactive organic semiconductor layer and the second electrode, the organic interlayer being an electron blocking layer or a self-organizing monomolecular layer, and being configured in such a way that a cut-off frequency of the photosensitive component is at least 1 Hz,
   wherein the produced photosensitive component is for radiation intensities of up to 1000 nW/cm$^2$.

2. The method as claimed in claim 1, wherein the organic interlayer is the electron blocking layer.

3. A photosensitive component comprising:
   a photoactive organic semiconductor layer;
   a first electrode;
   a second electrode; and
   an organic interlayer arranged between the photoactive organic semiconductor layer and the first electrode and between the organic semiconductor layers and the second electrode, the organic interlayer being an electron blocking layer or a self-organizing monomolecular layer, and being configured in such a way that a cut-off frequency of the photosensitive component is at least 1 Hz;
   wherein a single organic interlayer is arranged between the photoactive organic semiconductor layer and the first and second electrodes, to both form a first interlayer interface between the photoactive organic semiconductor layer and the first electrode and form a second interlayer interface between the photoactive organic semiconductor layer and the second electrode.

4. The photosensitive component as claimed in claim 3, wherein
   the organic interlayer forms trap states at each interlayer interface, and
   the organic interlayer influences the trap states in such a way that the cut-off frequency of the photosensitive component for a radiation intensity of up to 1000 nW/cm2 is at least 1 Hz.

5. The photosensitive component as claimed in claim 3, wherein the organic interlayer is the electron blocking layer.

6. The photosensitive component as claimed in claim 3, wherein the photoactive organic semiconductor layer comprises a bulk heterojunction.

7. The photosensitive component as claimed in claim 3, wherein
   the component photosensitive further comprises a substrate,
   the first electrode and the second electrode are arranged on the substrate,
   the organic interlayer is arranged on the first electrode and the second electrode, and
   the photoactive organic semiconductor layer is arranged on the organic interlayer.

8. The photosensitive component as claimed in claim 7, wherein
   an exposed portion of the substrate is positioned between the first and second electrodes, and
   the organic interlayer is arranged on the first electrode, on the second electrode and on the exposed portion of the substrate.

9. The photosensitive component as claimed in claim 3, wherein
   the component photosensitive further comprises a substrate,
   the photoactive organic semiconductor layer is arranged on the substrate,
   the organic interlayer is arranged on the photoactive organic semiconductor layer, and
   the first and second electrodes are arranged on the organic interlayer.

10. The photosensitive component as claimed in claim 3, wherein the organic interlayer is the self-organizing monomolecular layer.

11. The photosensitive component as claimed in claim 3, wherein at least one of the electrodes comprises nanoparticles.

12. An X-ray detector comprising:
    a scintillator unit; and
    the photosensitive component as claimed in claim 3.

13. A detection method for electromagnetic radiation, comprising:
    detecting electromagnetic radiation by using the photosensitive component as claimed in claim 3.

14. The detection method as claimed in claim 13, wherein in the detecting, the electromagnetic radiation has intensities of up to 1000 nW/cm$^2$, with a cut off frequency is at least 1 Hz.

15. The detection method as claimed in claim 13, wherein in the detecting, the electromagnetic radiation is in a visible, near infrared or near UV wavelength range.

16. A photosensitive component comprising:
    a photoactive organic semiconductor layer;
    a first electrode;
    a second electrode;
    a first organic interlayer arranged between the photoactive organic semiconductor layer and the first electrode, and
    a second organic interlayer formed between the photoactive organic semiconductor layer and the second electrode;
    wherein first and second organic interlayers comprise an electron blocking layer or a self-organizing monomolecular layer, and provide a cut-off frequency of the photosensitive component of at least 1 Hz.

* * * * *